(12) United States Patent
Moriwaki

(10) Patent No.: US 12,270,957 B2
(45) Date of Patent: Apr. 8, 2025

(54) PHOTOELECTRIC CONVERSION PANEL, X-RAY IMAGING PANEL, AND MANUFACTURING METHOD OF PHOTOELECTRIC CONVERSION PANEL

(71) Applicant: Sharp Display Technology Corporation, Kameyama (JP)

(72) Inventor: Hiroyuki Moriwaki, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 146 days.

(21) Appl. No.: 18/218,620

(22) Filed: Jul. 6, 2023

(65) Prior Publication Data

US 2024/0027634 A1    Jan. 25, 2024

(30) Foreign Application Priority Data

Jul. 20, 2022  (JP) .................. 2022-115522

(51) Int. Cl.
| | | |
|---|---|---|
| *G01T 1/20* | (2006.01) | |
| *H10F 39/00* | (2025.01) | |
| *H10F 39/18* | (2025.01) | |

(52) U.S. Cl.
CPC ......... *G01T 1/2018* (2013.01); *H10F 39/014* (2025.01); *H10F 39/028* (2025.01); *H10F 39/1898* (2025.01); *H10F 39/80377* (2025.01); *H10F 39/811* (2025.01)

(58) Field of Classification Search
CPC ... G01T 1/2018; H10F 39/014; H10F 39/028; H10F 39/1898; H10F 39/80377; H10F 39/811; H10F 39/1865; H10F 39/8033; A01K 67/34; A23B 2/70; A23B 99/00; H10D 64/605; H10D 86/423; H10H 20/01
See application file for complete search history.

(56) References Cited

U.S. PATENT DOCUMENTS

2019/0305025 A1    10/2019  Moriwaki
2020/0003911 A1 *   1/2020  Nara .................. H01L 27/14663

FOREIGN PATENT DOCUMENTS

JP          2019-174366 A       10/2019

* cited by examiner

*Primary Examiner* — Kiho Kim
(74) *Attorney, Agent, or Firm* — ScienBiziP, P.C.

(57) ABSTRACT

A photoelectric conversion panel includes a TFT, a photodiode, a first organic film formed on an upper layer from the photodiode, a bias line formed on an upper layer from the first organic film, a data line separated from the bias line, a second organic film covering the first organic film, the bias line, and the data line, and a first inorganic insulating film. Part of the second organic film is disposed between the bias line and the data line. The first inorganic insulating film covers the second organic film.

7 Claims, 17 Drawing Sheets

PHOTOELECTRIC CONVERSION PANEL, X-RAY IMAGING PANEL, AND MANUFACTURING METHOD OF PHOTOELECTRIC CONVERSION PANEL

CROSS-REFERENCE TO RELATED APPLICATIONS

This application claims the benefit of priority to Japanese Patent Application Number 2022-115522 filed on Jul. 20, 2022. The entire contents of the above-identified application are hereby incorporated by reference.

BACKGROUND

Technical Field

The disclosure relates to a photoelectric conversion panel, an X-ray imaging panel, and a manufacturing method of a photoelectric conversion panel.

A photoelectric conversion panel including thin film transistors and photoelectric conversion elements has been known. Such a photoelectric conversion panel is disclosed in, for example, JP 2019-174366 A.

JP 2019-174366 A discloses an imaging panel including a thin film transistor and a photoelectric conversion element. The imaging panel includes an active matrix substrate including the photoelectric conversion element in each of a plurality of pixels, a scintillator, and a moisture-proof material covering the active matrix substrate and the scintillator. The active matrix substrate includes a photoelectric conversion element formed on an upper layer from the thin film transistor, an organic film formed on an upper layer from the photoelectric conversion element, a bias line and a data line formed on an upper layer from the organic film, and an inorganic insulating film formed on an upper layer from the bias line and the data line. Here, when moisture enters the thin film transistor and the photoelectric conversion element, characteristics of the thin film transistor and the photoelectric conversion element degrade. In response to this, the imaging panel of JP 2019-174366 A is provided with a groove having an annular shape in a plan view and preventing moisture from entering from the outer periphery of the imaging panel.

SUMMARY

Here, in manufacturing an X-ray imaging panel, a scintillator is deposited on a photoelectric conversion panel, and the scintillator is covered with a moisture-proof film. Thus, a surface of the photoelectric conversion panel is exposed to the atmosphere in a period until the scintillator is deposited on the photoelectric conversion panel after the photoelectric conversion panel is manufactured. As a result, moisture enters a photoelectric conversion element and a thin film transistor in the photoelectric conversion panel, degrading characteristics of the photoelectric conversion element and the thin film transistor. In response to this, JP 2019-174366 A forms the bias line and the data line in a common layer and covers the layer covered with the inorganic insulating film to prevent entry of moisture.

However, in the layer in which the bias line and the data line are formed, part of a material of the bias line and the data line may remain between the bias line and the data line. In this case, the bias line and the data line are short-circuited by the remaining portion. In response to this, it is conceivable to disconnect the bias line from the data line by, for example, applying laser light between the bias line and the data line. However, in disconnecting the bias line from the data line, the organic film under the bias line and the data line is also irradiated with the laser light, forming a recessed portion in the organic film. As a result, the inorganic insulating film cannot cover the entire inside of the recessed portion, a gap is formed in the inorganic insulating film, moisture enters the organic film from the gap, and the moisture enters the photoelectric conversion element and the thin film transistor.

Thus, the disclosure has been made to solve the above-described problem, and an object of the disclosure is to provide a photoelectric conversion panel capable of preventing a short circuit between a bias line and a data line and preventing characteristics of a thin film transistor and a photoelectric conversion element from changing, an X-ray imaging panel, and a manufacturing method of the photoelectric conversion panel.

To solve the problem described above, a photoelectric conversion panel according to a first aspect of the disclosure includes: a substrate; a thin film transistor disposed on the substrate; a photoelectric conversion element disposed on an upper layer from the thin film transistor; a first organic film formed on an upper layer from the photoelectric conversion element; a wiring line layer formed on an upper layer from the first organic film; a second organic film covering the first organic film and the wiring line layer; and an inorganic insulating film covering the second organic film. The wiring line layer includes a bias line connected to the photoelectric conversion element and a data line connected to the thin film transistor and separated from the bias line. Part of the second organic film is disposed between the bias line and the data line.

An X-ray imaging panel according to a second aspect includes: a photoelectric conversion panel; and a scintillator overlapping the photoelectric conversion panel. The photoelectric conversion panel includes: a substrate; a thin film transistor disposed on the substrate; a photoelectric conversion element disposed on an upper layer from the thin film transistor; a first organic film formed on an upper layer from the photoelectric conversion element; a wiring line layer formed on an upper layer from the first organic film; a second organic film covering the first organic film and the wiring line layer; and an inorganic insulating film covering the second organic film. The wiring line layer includes a bias line connected to the photoelectric conversion element and a data line connected to the thin film transistor and separated from the bias line. Part of the second organic film is disposed between the bias line and the data line.

A manufacturing method of a photoelectric conversion panel according to a third aspect includes: forming a thin film transistor on a substrate; forming a photoelectric conversion element on an upper layer from the thin film transistor; forming a first organic film on an upper layer from the photoelectric conversion element; forming, on an upper layer from the first organic film, a wiring line layer including a bias line connected to the photoelectric conversion element and a data line connected to the thin film transistor; disconnecting the bias line from the data line; forming a second organic film covering the first organic film, the bias line, and the data line, part of the second organic film being disposed between the bias line and the data line; and forming an inorganic insulating film covering the second organic film.

According to the above-described configuration, part of the second organic film is disposed between the bias line and the data line even when the recessed portion is formed in the first organic film by performing a step of disconnecting the bias line from the data line to prevent a short circuit between the bias line and the data line. The second organic film covers the first organic film, the bias line, and the data line, thus leveling an upper surface of the photoelectric conversion panel. Then, the leveled upper surface is covered with the inorganic insulating film, and thus a gap is prevented from being formed in the inorganic insulating film. This can block moisture from entering the second organic film by using the inorganic insulating film and prevent moisture from entering the first organic film, the photoelectric conversion element, and the thin film transistor via the second organic film. As a result, a short circuit between the bias line and the data line can be prevented, and characteristics of the thin film transistor and the photoelectric conversion element can be prevented from changing.

BRIEF DESCRIPTION OF DRAWINGS

The disclosure will be described with reference to the accompanying drawings, wherein like numbers reference like elements.

DESCRIPTION OF EMBODIMENTS

Figure 1:
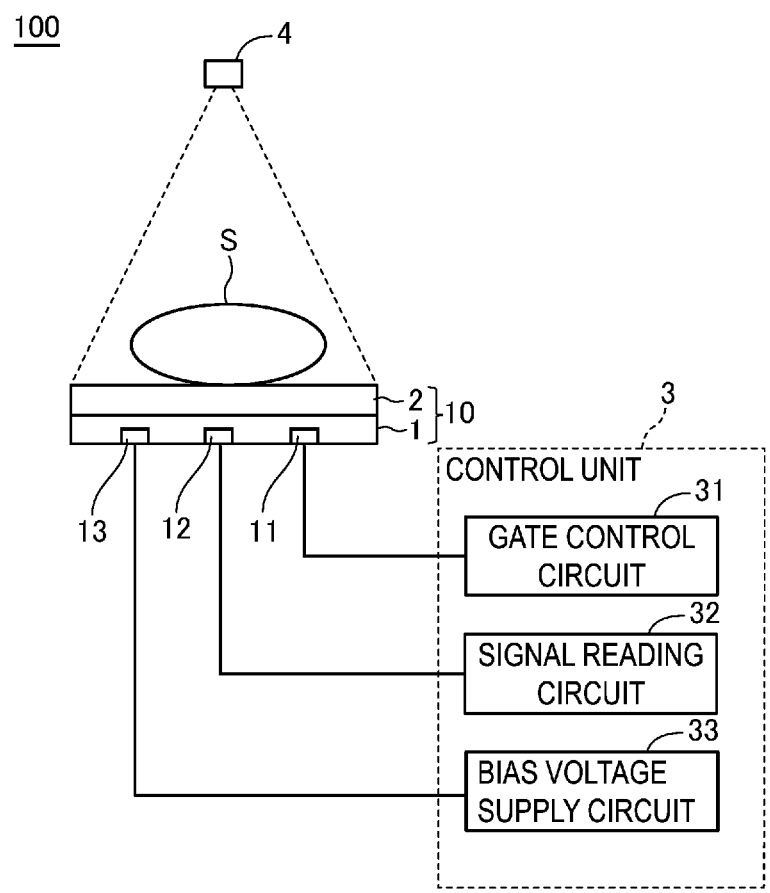
FIG. 1 is a schematic view illustrating an X-ray imaging device 100 provided with an X-ray imaging panel 10 including a photoelectric conversion panel 1 according to an embodiment.

Embodiments of the disclosure will be described below with reference to the drawings. Note that the disclosure is not limited to the following embodiments, and appropriate design changes can be made within a scope that satisfies the configuration of the disclosure. In the description below, the same reference signs are used in common among the different drawings for portions having the same or similar functions, and descriptions of repetitions thereof will be omitted. The configurations described in the embodiments and the modified examples may be combined or modified as appropriate within a range that does not depart from the gist of the disclosure. For ease of explanation, in the drawings referenced below, the configuration is simplified or schematically illustrated, or a portion of the components are omitted. Dimensional ratios between components illustrated in the drawings are not necessarily indicative of actual dimensional ratios.

Configuration of X-ray Imaging Device

FIG. 1 is a schematic view illustrating an X-ray imaging device 100 provided with an X-ray imaging panel 10 including a photoelectric conversion panel 1 according to the present embodiment. The X-ray imaging device 100 is provided with the X-ray imaging panel 10 including the photoelectric conversion panel 1 and a scintillator 2, a control unit 3, and an X-ray source 4. The control unit 3 includes a gate control circuit 31, a signal reading circuit 32, and a bias voltage supply circuit 33. The gate control circuit 31 is connected to a gate terminal 11 of the photoelectric conversion panel 1. The signal reading circuit 32 is connected to a data terminal 12. The bias voltage supply circuit 33 is connected to a bias terminal 13.

The X-ray source 4 irradiates a subject S with X-rays. X-rays passing through the subject S are converted into fluorescence (hereinafter, referred to as "scintillation light") in the scintillator 2 disposed at an upper portion of the photoelectric conversion panel 1. The X-ray imaging device 100 generates an X-ray image by imaging the scintillation light with the X-ray imaging panel 10.

Figure 2:
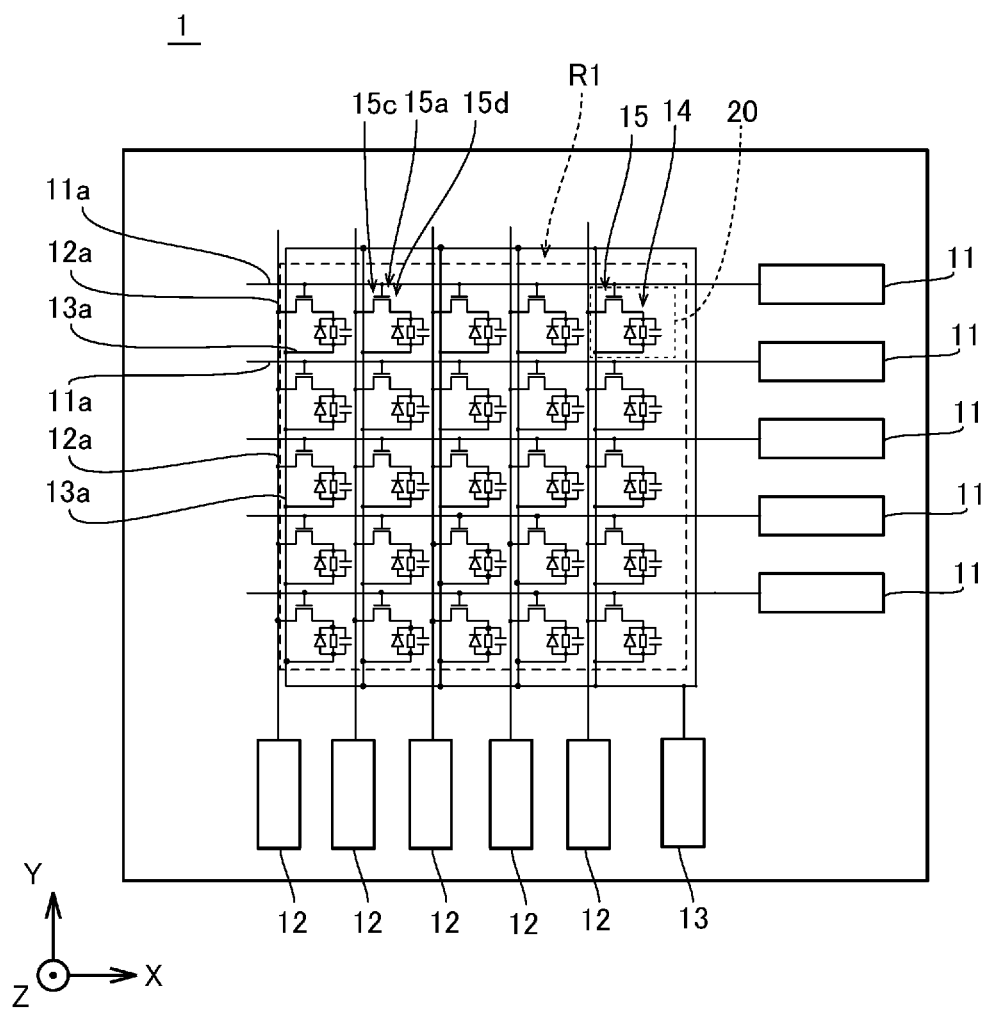
FIG. 2 is a schematic plan view illustrating a schematic configuration of the photoelectric conversion panel 1.

FIG. 2 is a schematic view illustrating a schematic configuration of the photoelectric conversion panel 1. The photoelectric conversion panel 1 includes a plurality of the gate terminals 11, a plurality of the data terminals 12, the bias terminal 13, a plurality of photodiodes 14, and a plurality of thin film transistors (TFTs) 15. A plurality of gate lines 11a that connect gate electrodes 15a of the plurality of TFTs 15 and the respective gate terminals 11, a plurality of data lines 12a that connect source electrodes 15c of the plurality of TFTs 15 and the respective data terminals 12, and bias lines 13a connected to the plurality of photodiodes 14 are formed on a substrate 101 (see FIG. 3) of the photoelectric conversion panel 1.

As illustrated in FIG. 2, the photoelectric conversion panel 1 is provided with a pixel region R1. The pixel region R1 has, for example, a rectangular shape in a plan view. The pixel region R1 is a region in which a plurality of pixels 20 partitioned by the plurality of gate lines 11a and the plurality of data lines 12a are formed. The photoelectric conversion panel 1 includes the gate terminals 11, the data terminals 12, and the bias terminal 13. The gate terminals 11, the data terminals 12, and the bias terminal 13 are disposed outside the pixel region R1.

As illustrated in FIG. 2, the pixel region R1 includes the plurality of gate lines 11a and the plurality of data lines 12a formed intersecting each other. Thus, the plurality of pixels 20 is formed in a matrix in the plan view. The bias line 13a is formed, for example, along the data line 12a. Each of the pixels 20 is provided with the photodiode 14 and the TFT 15. The photodiode 14 and the TFT 15 are each disposed in a matrix in the plan view.

The plurality of gate terminals 11 transmits a gate signal from the gate control circuit 31 to the gate line 11a. The plurality of data terminals 12 applies a reading voltage from the signal reading circuit 32 to the data line 12a. The plurality of data terminals 12 acquires a data signal from the photodiode 14 via the data line 12a and the TFT 15 and transmits the data signal to the signal reading circuit 32. The bias terminal 13 supplies a bias voltage from the bias voltage supply circuit 33 to the bias line 13a. Each gate line 11a is sequentially switched to a select state by being supplied with the gate signal from the gate control circuit 31, turning the TFT 15 connected to the gate line 11a in the select state to an on state. The photodiode 14 to which the bias voltage is being applied from the bias line 13a converts the scintillation light into an electric charge corresponding to the amount of the scintillation light and outputs, when the TFT 15 is turned on, a signal (data signal) corresponding to the electric charge to the signal reading circuit 32.

Figure 3:
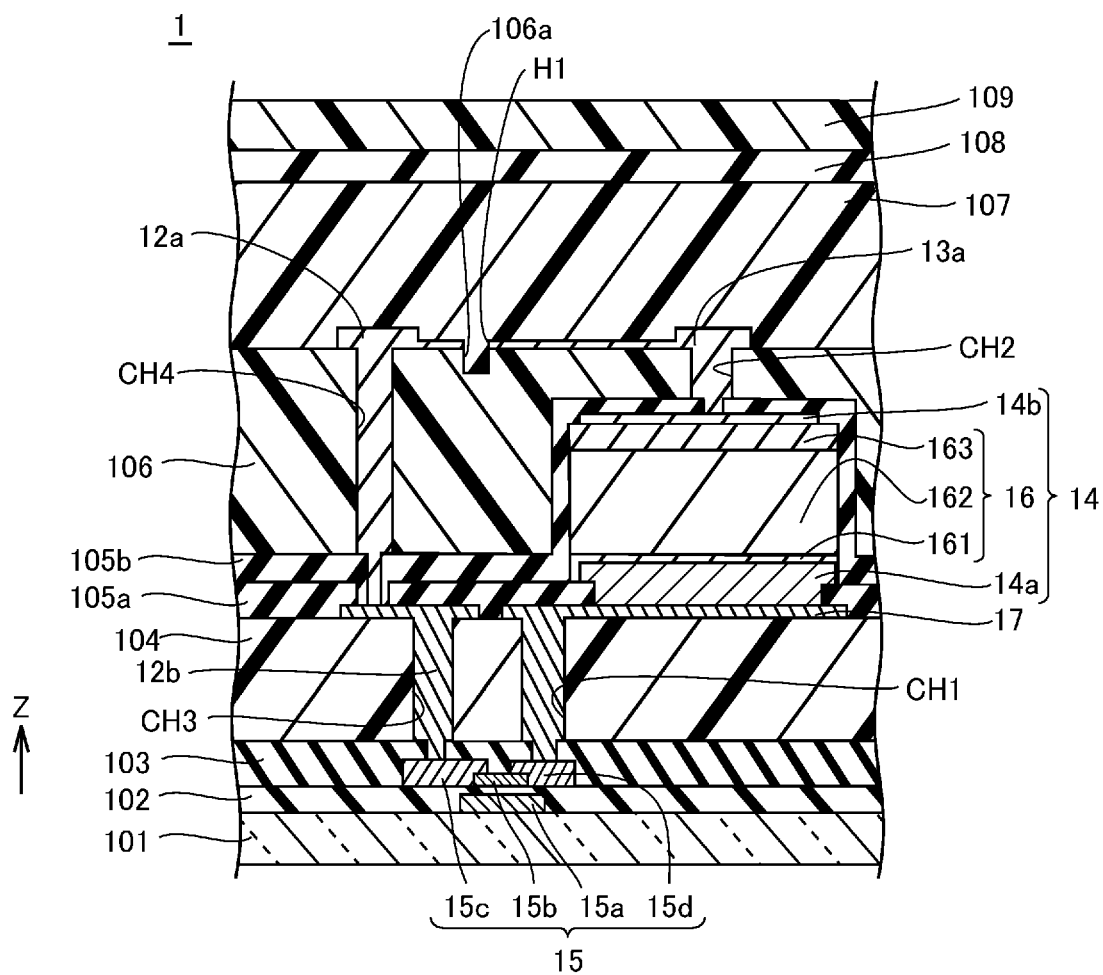
FIG. 3 is a cross-sectional view of the photoelectric conversion panel 1 in a pixel region R1.

FIG. 3 is a cross-sectional view of the photoelectric conversion panel 1 in the pixel region R1. As illustrated in FIG. 3, the photoelectric conversion panel 1 includes the substrate 101, a first organic film 106, a second organic film 107, a third organic film 109, a fourth organic film 104, a first inorganic insulating film 108, a second lower inorganic insulating film 105a, a second upper inorganic insulating film 105b, a third inorganic insulating film 103, and a gate insulating film 102. The photoelectric conversion panel 1 is provided with a first lower electrode 17 connected to the TFT 15. The photodiode 14 includes a second lower electrode 14a, an upper electrode 14b, and a photoelectric conversion layer 16. The photoelectric conversion layer 16 is provided between the second lower electrode 14a and the upper electrode 14b.

The TFT 15 includes the gate electrode 15a integrated with the gate line 11a, a semiconductor active layer 15b, the source electrode 15c connected to the data line 12a, and a drain electrode 15d. The drain electrode 15d and the second lower electrode 14a are connected through the first lower electrode 17 provided in a contact hole CH1. Part of the bias line 13a is provided in a contact hole CH2, and the bias line 13a supplies the bias voltage to the photodiode 14 through the contact hole CH2. The source electrode 15c is connected to the data line 12a through a source connection electrode 12b, which will be described below, provided in a contact hole CH3.

Configuration of Recessed Portion

Here, in the present embodiment, as illustrated in FIG. 3, the first organic film 106 includes a recessed portion 106a in which part of the second organic film 107 is disposed between the bias line 13a and the data line 12a. The recessed portion 106a is recessed from an upper surface of the first organic film 106 toward the substrate 101 side. The recessed portion 106a is filled with the second organic film 107. The recessed portion 106a is formed in step S15 of a manufacturing method of the photoelectric conversion panel 1 described below. In the present embodiment, the first inorganic insulating film 108 is formed on an upper layer from the second organic film 107. Then, the third organic film 109 covers the first inorganic insulating film 108.

According to the above-described configuration, part of the second organic film 107 is disposed between the bias line 13a and the data line 12a (in the recessed portion 106a) even when the recessed portion 106a is formed in the first organic film 106 by performing a step of disconnecting the bias line 13a from the data line 12a to prevent a short circuit between the bias line 13a and the data line 12a. Then, the second organic film 107 covers the first organic film 106, the bias line 13a, and the data line 12a, and thus an upper surface of the photoelectric conversion panel 1 is leveled by the second organic film 107. Then, the leveled upper surface is covered with the first inorganic insulating film 108, and thus a gap is prevented from being formed in the first inorganic insulating film 108. This can block moisture from entering the second organic film 107 by using the first inorganic insulating film 108 and prevent moisture from entering the first organic film 106, the photodiode 14, and the TFT 15 via the second organic film 107. As a result, a short circuit between the bias line 13a and the data line 12a can be prevented, and characteristics of the photodiode 14 and the TFT 15 can be prevented from changing.

Configuration of Thin Film Transistor

As illustrated in FIG. 3, the gate electrode 15a and the gate insulating film 102 are formed on the substrate 101. The substrate 101 is a substrate with an insulating property. The gate electrode 15a is composed of a layered film containing, for example, tungsten (W) and tantalum nitride (TaN) as materials.

The gate insulating film 102 covers the gate electrode 15a. For the gate insulating film 102, for example, silicon oxide (SiOx), silicon nitride (SiNx), silicon oxynitride (SiOxNy) (x>y), and silicon nitride oxide (SiNxOy) (x>y) may be used. In the present embodiment, the gate insulating film 102 includes an insulating film consisting of silicon oxide (SiOx) on an upper layer and an insulating film consisting of silicon nitride (SiNx) on a lower layer that are layered.

The semiconductor active layer 15b is provided on the gate electrode 15a with the gate insulating film 102 interposed therebetween. Then, the source electrode 15c and the drain electrode 15d connected to the semiconductor active layer 15b are provided on the gate insulating film 102.

The semiconductor active layer 15b is in contact with the gate insulating film 102. The semiconductor active layer 15b consists of an oxide semiconductor. In the present embodiment, the oxide semiconductor includes an In—Ga—Zn—O based oxide semiconductor. In detail, as the oxide semiconductor, for example, InGaO3 (ZnO)5, magnesium zinc oxide (MgxZn1-xO), cadmium zinc oxide (CdxZn1-xO), cadmium oxide (CdO), or an amorphous oxide semiconductor containing indium (In), gallium (Ga), and zinc (Zn) at a predetermined ratio may be used. This configuration optimizes an oxidation action by the fourth organic film 104 on the TFT 15 and a reduction action by the second lower inorganic insulating film 105a (silicon nitride) on the TFT 15, and thus turning a current-voltage characteristic (I-V characteristic) of the TFT into a depletion type can be suppressed. The TFT 15 can be made to have high speed performance.

The source electrode 15c and the drain electrode 15d are disposed to be in contact with part of the semiconductor active layer 15b on the gate insulating film 102. The drain electrode 15d is connected to the first lower electrode 17 part of which is disposed in the contact hole CH1. The source electrode 15c is connected to the source connection electrode 12b part of which is disposed in the contact hole CH3. The source connection electrode 12b is connected to the data line 12a. The drain electrode 15d is connected to the first lower electrode 17 part of which is disposed in the contact hole CH1. The source electrode 15c and the drain electrode 15d are formed in the same layer. The source electrode 15c and the drain electrode 15d have a triple-layer structure layered such that two metal films made of titanium (Ti) sandwich a metal film made of aluminum (Al), for example.

The third inorganic insulating film 103 is provided to overlap the source electrode 15c and the drain electrode 15d on the gate insulating film 102. The third inorganic insulating film 103 includes the contact hole CH1 on the drain electrode 15d and includes the contact hole CH3 on the source electrode 15c. In this example, the third inorganic insulating film 103 is composed of, for example, an inorganic insulating film (a single-layer film, a layered film) consisting of silicon oxide (SiO2) or a nitride film (SiNx).

Configuration of Fourth Organic Film

The fourth organic film 104 is provided on the third inorganic insulating film 103. In other words, the fourth organic film 104 is formed on an upper layer from the TFT 15. Thus, the fourth organic film 104 has a function as a flattening film of the TFT 15. The fourth organic film 104 and the third inorganic insulating film 103 include the contact hole CH1 formed on the drain electrode 15d and the contact hole CH3 formed on the source electrode 15c. The fourth organic film 104 consists of, for example, organic transparent resin such as acrylic resin or siloxane resin. In the present embodiment, the fourth organic film 104 consists of photosensitive acrylic resin.

Configurations of First Lower Electrode and Source Connection Electrode

The first lower electrode 17 and the source connection electrode 12b are provided on the fourth organic film 104. Part of the first lower electrode 17 is formed in the contact hole CH1, and the first lower electrode 17 connects the drain electrode 15d and the second lower electrode 14a. Part of the source connection electrode 12b is formed in the contact hole CH3, and the first lower electrode 17 connects the source electrode 15c and the data line 12a. The first lower electrode 17 and the source connection electrode 12b have a triple-layer structure layered such that two metal films made of titanium (Ti) and having different film thicknesses from each other (100 nm and 50 nm) sandwich a metal film (300 nm) made of aluminum (Al). The first lower electrode 17 and the source connection electrodes 12b may be composed of a single-layer structure made of aluminum. Here, the first lower electrode 17 and the source connection electrode 12b contain aluminum. Thus, the first lower electrode 17 and the source connection electrode 12b have relatively low resistance values, because aluminum has a relatively small resistance value.

Configuration of Second Lower Inorganic Insulating Film

The second lower inorganic insulating film 105a covering part of the first lower electrode 17 and part of the fourth organic film 104 is provided on the first lower electrode 17. For the second lower inorganic insulating film 105a, for example, silicon oxide (SiOx), silicon nitride (SiNx), silicon oxynitride (SiOxNy) (x>y), and silicon nitride oxide (SiNxOy) (x>y) may be used. In the present embodiment, the second lower inorganic insulating film 105a is made of silicon oxynitride (SiNx). The second lower inorganic insulating film 105a is provided with an opening provided with the second lower electrode 14a on the first lower electrode 17. The second lower inorganic insulating film 105a is provided with a contact hole CH4 in which part of the data line 12a is provided on the source connection electrode 12b. A film thickness of the second lower inorganic insulating film 105a is equal to or larger than 100 nm and equal to or smaller than 500 nm, for example. Due to the film thickness, the exposure of the first lower electrode 17 in an etching step of the photoelectric conversion layer 16 in manufacturing the photoelectric conversion panel 1 can be suppressed. In the present embodiment, the film thickness of the second lower inorganic insulating film 105a is, for example, 350 nm.

Configuration of Second Lower Electrode

The second lower electrode 14a is provided so as to cover the first opening of the second lower inorganic insulating film 105a and part of the second lower inorganic insulating film 105a. The second lower electrode 14a is formed of titanium (Ti) having a resistance higher than that of aluminum (Al). A film thickness of the second lower electrode 14a is, for example, equal to or larger than 10 nm and equal to or smaller than 50 nm. This film thickness can suppress scatter of part of the second lower electrode 14a in the etching step of the photoelectric conversion layer 16 in manufacturing the photoelectric conversion panel 1. In the present embodiment, the film thickness of the second lower electrode 14a is 30 nm.

Configuration of Photoelectric Conversion Layer

The photoelectric conversion layer 16 is provided on the second lower electrode 14a. The photoelectric conversion layer 16 includes an n-type amorphous semiconductor layer 161, an intrinsic amorphous semiconductor layer 162, and a p-type amorphous semiconductor layer 163 sequentially layered. The n-type amorphous semiconductor layer 161 consists of amorphous silicon doped with n-type impurities (for example, phosphorus). The intrinsic amorphous semiconductor layer 162 consists of intrinsic amorphous silicon. The intrinsic amorphous semiconductor layer 162 is formed so as to be in contact with the n-type amorphous semiconductor layer 161. The p-type amorphous semiconductor layer 163 consists of amorphous silicon doped with p-type impurities (for example, boron). The p-type amorphous semiconductor layer 163 is formed so as to be in contact with the intrinsic amorphous semiconductor layer 162.

The upper electrode 14b is provided on the photoelectric conversion layer 16. For example, the upper electrode 14b is composed of indium tin oxide (ITO). That is, the photodiode 14 is formed on an upper layer from the fourth organic film 104.

Configuration of Second Upper Inorganic Insulating Film

The second upper inorganic insulating film 105b is provided so as to cover the photodiode 14 and at least part of the second lower inorganic insulating film 105a. The second upper inorganic insulating film 105b covers the upper surface of the photodiode 14 and the side surface of the photodiode 14. The second upper inorganic insulating film 105b corresponds to a passivation film and a coating film for the photodiode 14, the first lower electrode 17, and the source connection electrode 12b.

The contact hole CH2 is provided on the upper electrode 14b in the second upper inorganic insulating film 105b, and the contact hole CH4 is provided on the source connection electrode 12b.

Configuration of First Organic Film

The first organic film 106 that covers at least part of the second upper inorganic insulating film 105b is formed on an upper layer from the fourth organic film 104. The first organic film 106 is a flattening film that levels a stepped portion formed by the photodiode 14. The first organic film 106 is made of a material similar to that of the fourth organic film 104, for example. The first organic film 106 is made of organic transparent resin such as acrylic resin or siloxane resin. In the present embodiment, the first organic film 106 is made of photosensitive acrylic resin. The contact hole CH2 and the contact hole CH4 are provided in the first organic film 106.

Configurations of Bias Line and Source Line

The bias line 13a and the data line 12a are provided on the first organic film 106. The bias line 13a is in contact with the upper electrode 14b in the contact hole CH2. The data line 12a is in contact with the source connection electrode 12b in the contact hole CH4.

The bias line 13a is connected to the bias terminal 13 (see FIG. 2). The bias line 13a applies a bias voltage input to the bias terminal 13 to the upper electrode 14b via the contact hole CH2. The data line 12a is connected to the data terminal 12 (see FIG. 2). When the TFT 15 is in the on state, a signal corresponding to an electric charge converted in the photodiode 14 is output to the signal reading unit 3b through the data line 12a. The data line 12a and the bias line 13a are made of, from the lower layer, a layered metal film made of, for example, Ti, aluminum, Ti, and ITO. Containing aluminum in the data line 12a and the bias line 13a contributes to lowering of resistances that are important for characteristics of wiring lines. Ti serves as a barrier layer that prevents surface oxidation of aluminum. Containing ITO in the data line 12a and the bias line 13a can form terminals for external mounting at the same layer. When the data line 12a, the bias line 13a, and the terminals for external mounting are not formed in the same layer, the data line 12a and the bias line 13a do not need to contain ITO.

A portion H1 that separates the bias line 13a from the data line 12a is provided between the bias line 13a and the data line 12a. The portion H1 is connected to the recessed portion 106a of the first organic film 106.

Configuration of Second Organic Film

The second organic film 107 that covers the bias line 13a and the data line 12a are provided on an upper layer from the first organic film 106. Part of the second organic film 107 constitutes the portion H1 and fills the recessed portion 106a. The second organic film 107 is a flattening film that levels the recessed portion 106a of the first organic film 106, the bias line 13a, and the data line 12a. The second organic film 107 is made of a material similar to that of the first organic film 106, for example. The second organic film 107 is made of organic transparent resin such as acrylic resin or siloxane resin. In the present embodiment, the second organic film 107 is made of photosensitive acrylic resin.

Configuration of First Inorganic Insulating Film

The first inorganic insulating film 108 that covers the second organic film 107 is provided on the second organic film 107. The first inorganic insulating film 108 is made of, for example, silicon nitride (SiN). The first inorganic insulating film 108 is a passivation film.

Configuration of Third Organic Film

The third organic film 109 that covers the first inorganic insulating film 108 is provided on the first inorganic insulating film 108. The third organic film 109 is made of a material similar to that of the second organic film 107, for example. The third organic film 109 is made of organic transparent resin such as acrylic resin or siloxane resin. In the present embodiment, the third organic film 109 is made of photosensitive acrylic resin.

Manufacturing Method of Photoelectric Conversion Panel

Figure 4:
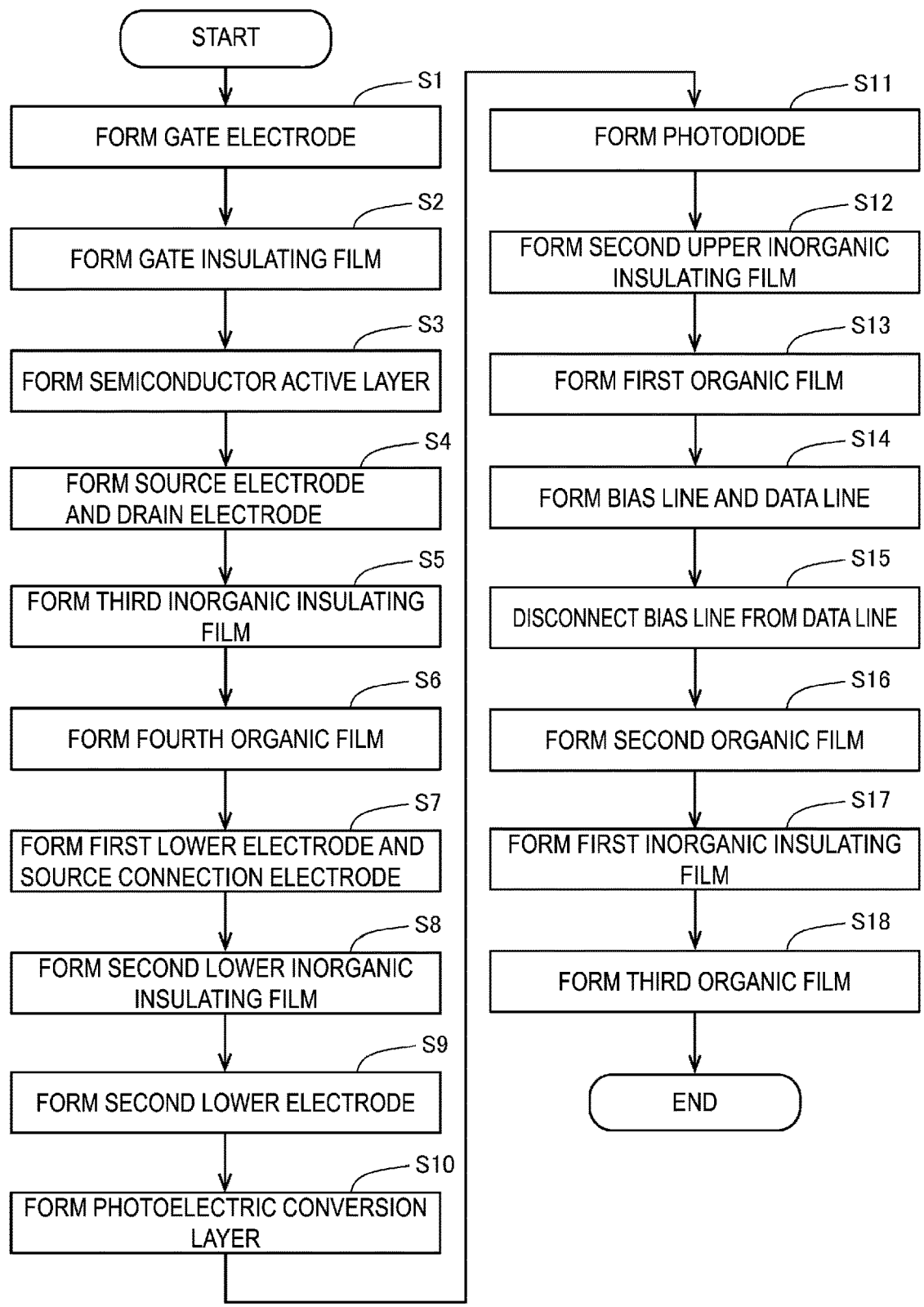
FIG. 4 is a flowchart for explaining a manufacturing process of the photoelectric conversion panel 1.

Next, a manufacturing method of the photoelectric conversion panel 1 will be described with reference to FIGS. 4 to 17. FIG. 4 is a flowchart for explaining a manufacturing process of the photoelectric conversion panel 1.

Figure 5:
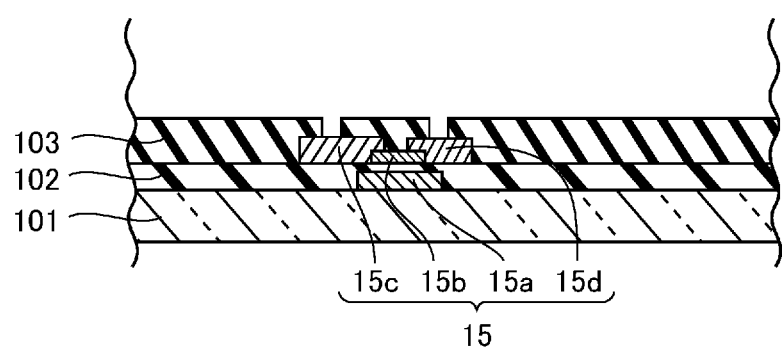
FIG. 5 is a cross-sectional view (1) for explaining a manufacturing process of the photoelectric conversion panel 1.

As illustrated in FIG. 4 and FIG. 5, in step S1, the gate electrode 15a is formed on the substrate 101. Specifically, a layered film made of tungsten (W) and tantalum nitride (TaN) is formed on the substrate 101, for example, by a sputtering method. Then, the gate electrode 15a is formed by performing a photolithography method and dry etching.

In step S2, the gate insulating film 102 is formed so as to cover the gate electrode 15a. For example, by using a CVD method, a layered film of silicon oxide (SiOx) and silicon nitride (SiNx) is formed, thereby forming the gate insulating film 102.

In step S3, the semiconductor active layer 15b is formed on the gate electrode 15a with the gate insulating film 102 interposed therebetween. For example, an In—Ga—Zn—O based oxide semiconductor is formed by a sputtering method, and a photolithography method and dry etching are performed to form the semiconductor active layer 15b. Although not illustrated, the photolithography method and the dry etching are performed in this step, thereby forming a gate contact.

In step S4, the source electrode 15c and the drain electrode 15d are formed. For example, a layered film layered such that two metal films made of titanium (Ti) sandwich a metal film made of aluminum (Al) is formed by a sputtering method, and a photolithography method and dry etching are performed to form the source electrode 15c and the drain electrode 15d.

In step S5, as illustrated in FIG. 5, the third inorganic insulating film 103 is formed on the gate insulating film 102, the source electrode 15c, and the drain electrode 15d. For example, an inorganic insulating film (single-layer film) made of silicon oxide (SiO2) is formed by using a CVD method, and a photolithography method and dry etching are performed to form the third inorganic insulating film 103. In this step, the contact holes CH1 and CH3 are formed in the third inorganic insulating film 103.

Figure 6:
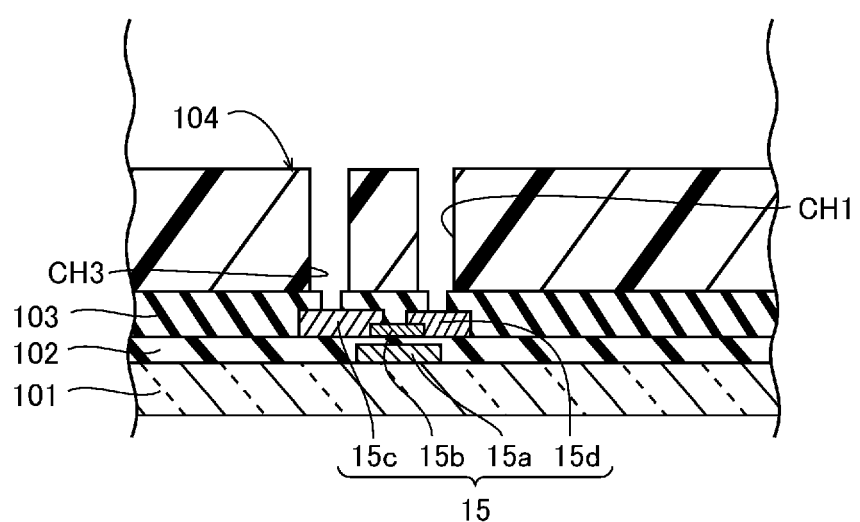
FIG. 6 is a cross-sectional view (2) for explaining a manufacturing process of the photoelectric conversion panel 1.

As illustrated in FIG. 6, the fourth organic film 104 is formed on the third inorganic insulating film 103 (on an upper layer from the TFT 15). For example, photosensitive acrylic resin is applied to the third inorganic insulating film 103 to form the fourth organic film 104. A photolithography method and etching are performed to form the contact holes CH1 and CH3 in the fourth organic film 104.

Figure 7:
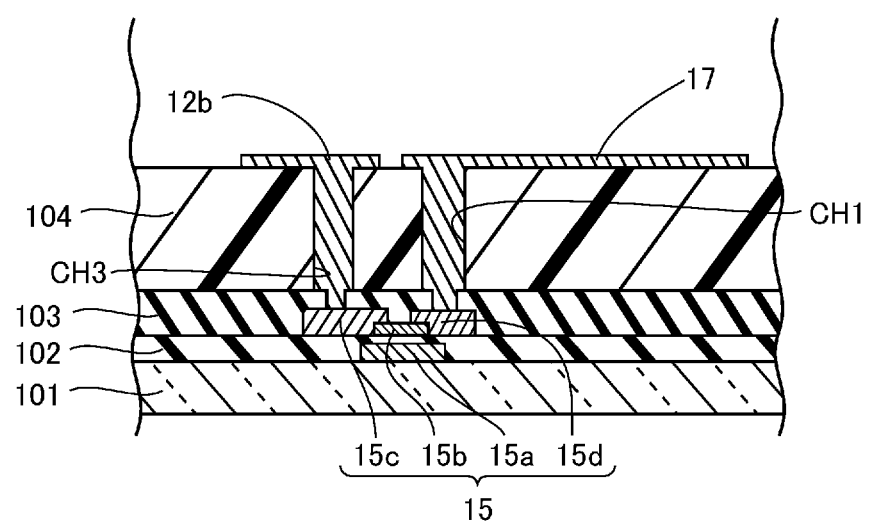
FIG. 7 is a cross-sectional view (3) for explaining a manufacturing process of the photoelectric conversion panel 1.

In step S7, as illustrated in FIG. 7, the first lower electrode 17 and the source connection electrode 12b are formed on the fourth organic film 104. For example, a single-layer film made of aluminum (Al), or a layered film layered such that two metal films made of titanium (Ti) sandwich a metal film made of aluminum (Al) is formed by a sputtering method, and a photolithography method and dry etching are performed to form the first lower electrode 17 and the source connection electrode 12b.

Figure 8:
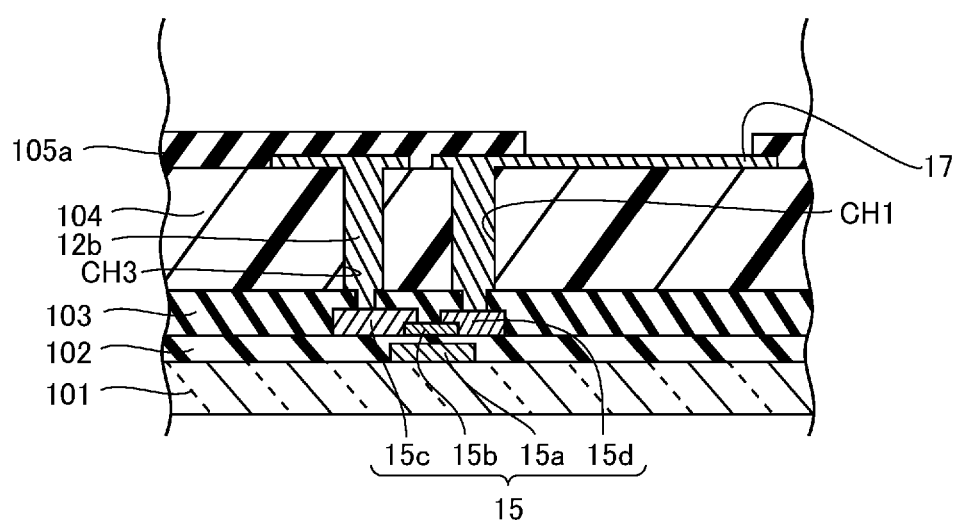
FIG. 8 is a cross-sectional view (4) for explaining a manufacturing process of the photoelectric conversion panel 1.

In step S8, as illustrated in FIG. 8, the second lower inorganic insulating film 105a that covers part of the first lower electrode 17 and part of the fourth organic film 104 is formed on the first lower electrode 17. For example, an inorganic insulating film (single-layer film) made of silicon nitride (SiNx) is formed by using a CVD method, and a photolithography method and dry etching are performed to form the second lower inorganic insulating film 105a. The second lower inorganic insulating film 105a may be made of silicon oxide (SiO2) instead of silicon nitride (SiNx). In this step, in the second lower inorganic insulating film 105a, an opening to be provided with the second lower electrode 14a is formed on the first lower electrode 17. In the second lower inorganic insulating film 105a, the contact hole CH4 to be provided with the data line 12a is formed on the source connection electrode 12b. A film thickness of the second lower inorganic insulating film 105a is formed so as to have a size being, for example, equal to or larger than 100 nm and equal to or smaller than 500 nm. This film thickness can suppress the exposure of the first lower electrode 17 in the etching step of the photoelectric conversion layer 16.

Figure 9:
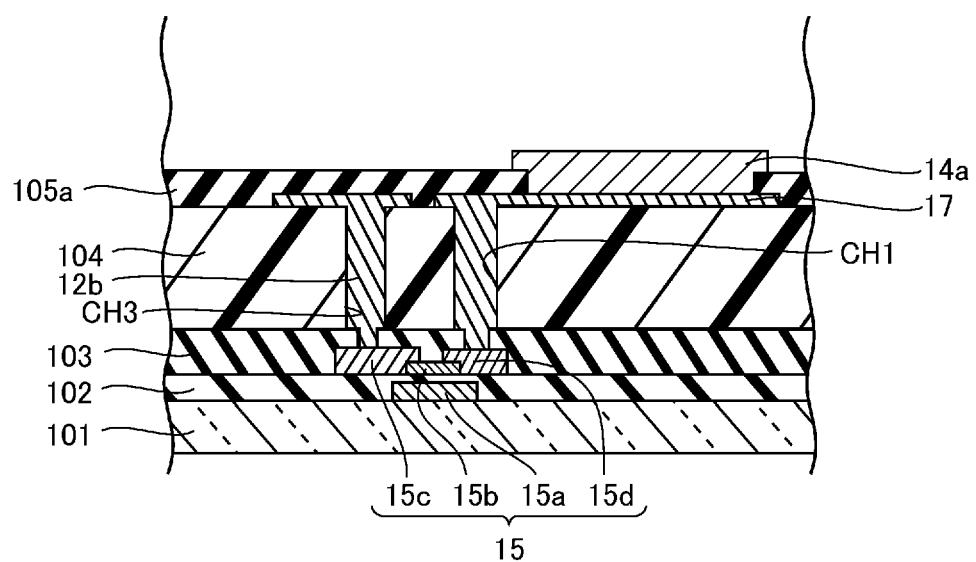
FIG. 9 is a cross-sectional view (5) for explaining a manufacturing process of the photoelectric conversion panel 1.

In step S9, as illustrated in FIG. 9, the second lower electrode 14a is formed so as to cover part of the second lower inorganic insulating film 105a. For example, a metal film made of titanium (Ti) is formed by a sputtering method, and a photolithography method and dry etching are performed to form the second lower electrode 14a. Here, a peripheral portion other than a portion to be formed as the photoelectric conversion layer 16 is removed before the step of forming the photoelectric conversion layer 16 (step S10), and thus, in the step of forming the photoelectric conversion layer 16, scatter of a material toward the side surface (side wall) of the photoelectric conversion layer 16 can be suppressed. For example, the second lower electrode 14a having a film thickness being equal to or larger than 10 nm and equal to or smaller than 50 nm is formed. Due to this film thickness, scatter of part of the second lower electrode 14a can be suppressed in the etching step of the photoelectric conversion layer 16. In the present embodiment, the film thickness of the second lower electrode 14a is 30 nm.

Figure 10:
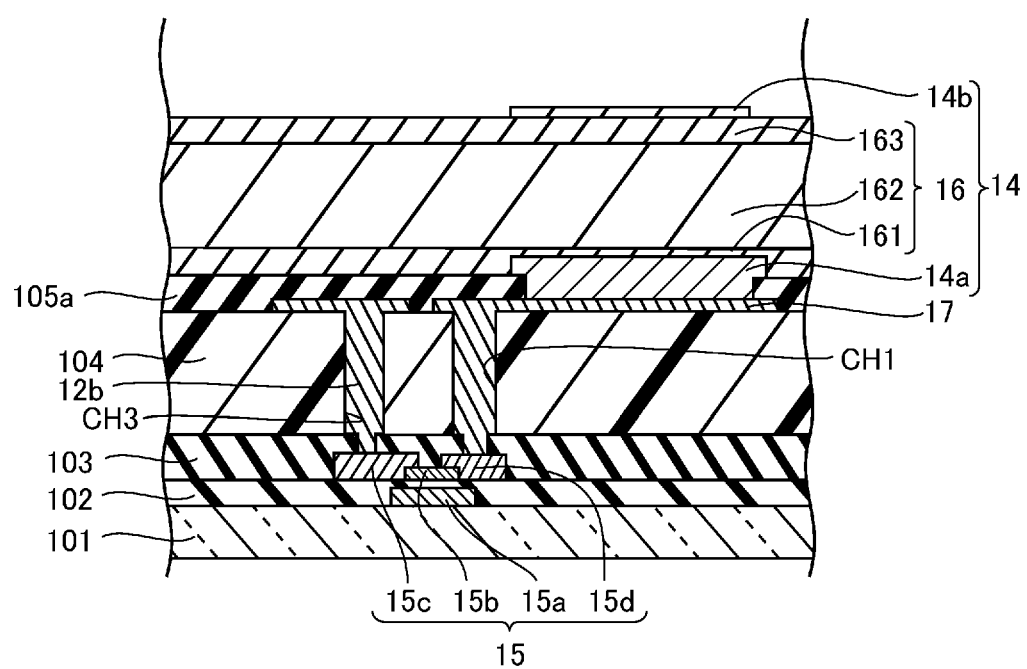
FIG. 10 is a cross-sectional view (6) for explaining a manufacturing process of the photoelectric conversion panel 1.

In step S10, as illustrated in FIG. 10, the photoelectric conversion layer 16 is formed on the second lower electrode 14a. For example, by a CVD method, the n-type amorphous semiconductor layer 161 made of amorphous silicon doped with n-type impurities (for example, phosphorus), the intrinsic amorphous semiconductor layer 162 made of intrinsic amorphous silicon, and the p-type amorphous semiconductor layer 163 made of amorphous silicon doped with p-type impurities (for example, boron) are layered in order.

Then, the upper electrode 14b is formed on the photoelectric conversion layer 16. An ITO film is formed by, for example, a sputtering method. Then, a photolithography method and wet etching are performed to form the upper electrode 14b. After forming the upper electrode 14b, treatment may be performed with hydrogen plasma or the like to repair damage caused by etching of the side wall of the photoelectric conversion layer 16. In this case, after forming the ITO film, a passivation film that covers the ITO film may be formed before the etching step.

Figure 11:
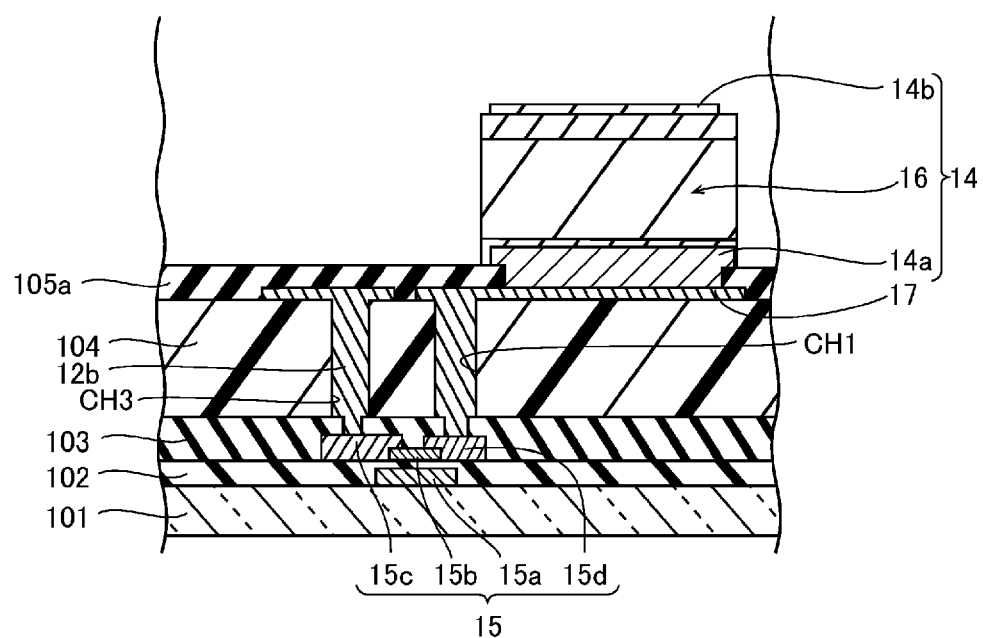
FIG. 11 is a cross-sectional view (7) for explaining a manufacturing process of the photoelectric conversion panel 1.

In step S11, as illustrated in FIG. 11, a photolithography method and dry etching are performed to form the photoelectric conversion layer 16, and the photodiode 14 is formed.

Figure 12:
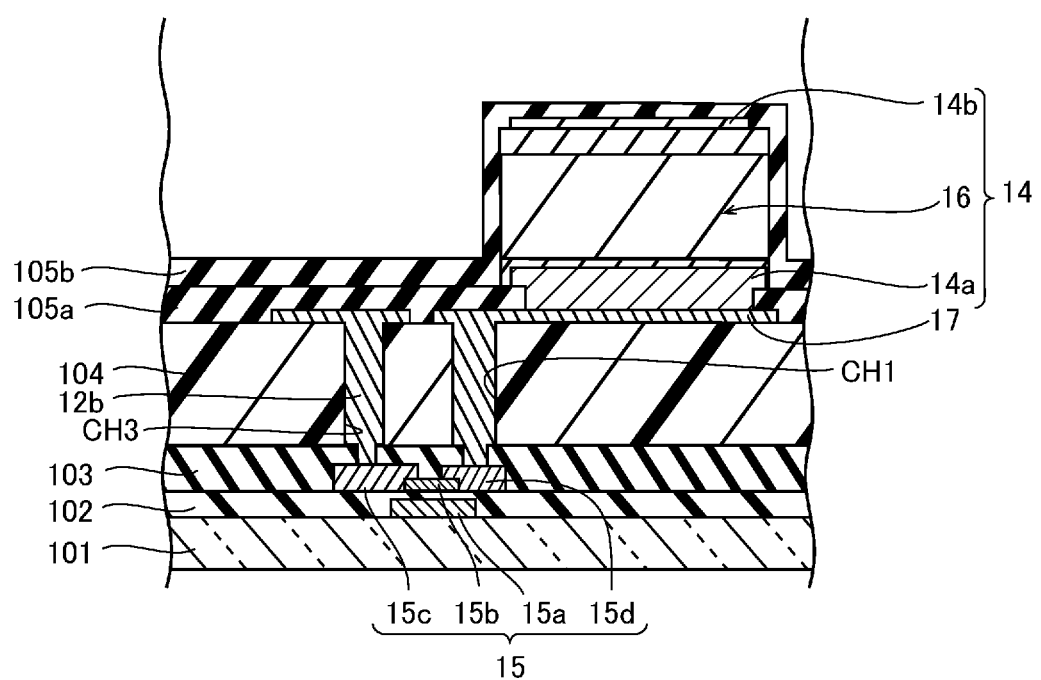
FIG. 12 is a cross-sectional view (8) for explaining a manufacturing process of the photoelectric conversion panel 1.

In step S12, as illustrated in FIG. 12, the second upper inorganic insulating film 105b is formed so as to cover the photodiode 14 and at least part of the second lower inorganic insulating film 105a. For example, an inorganic insulating film made of silicon nitride (SiNx) is formed by a CVD method, and a photolithography method and dry etching are performed to form the second upper inorganic insulating film 105b.

Figure 13:
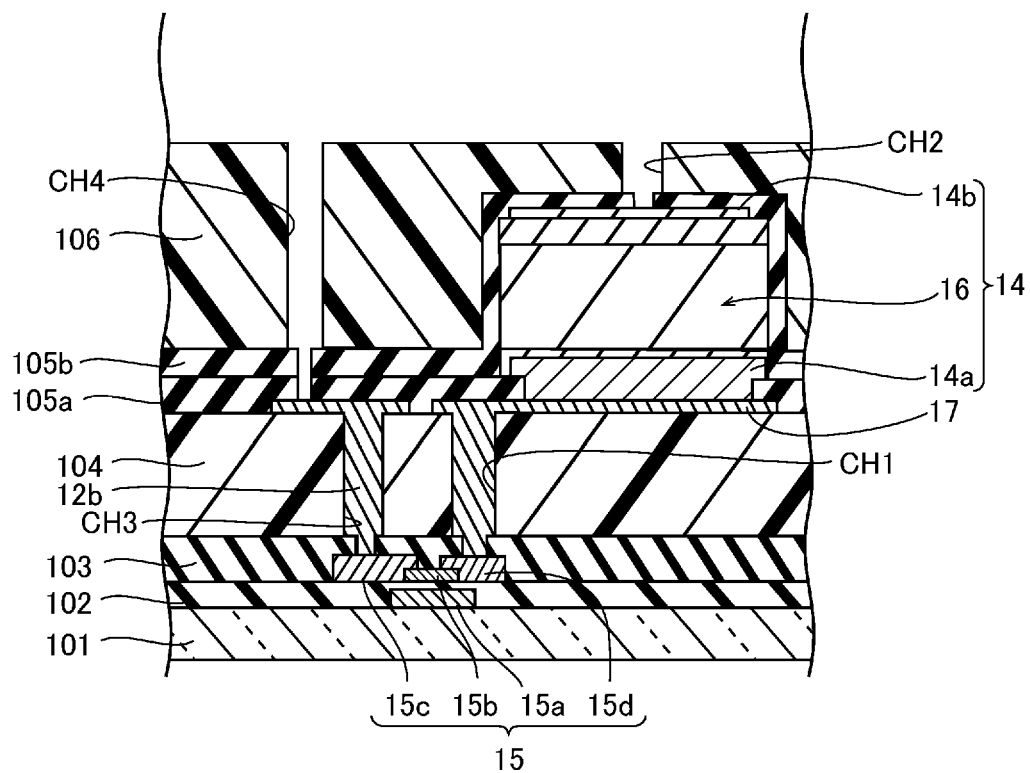
FIG. 13 is a cross-sectional view (9) for explaining a manufacturing process of the photoelectric conversion panel 1.

In step S13, as illustrated in FIG. 13, the first organic film 106 that covers at least part of the second upper inorganic insulating film 105b is formed on the upper layer from the fourth organic film 104. For example, photosensitive acrylic resin is applied to the second upper inorganic insulating film 105b to form the first organic film 106. Then, a photolithography method and etching are performed to form the contact hole CH2 and the contact hole CH4 in the first organic film 106. In this step, the contact hole CH2 is formed on the upper electrode 14b in the second upper inorganic insulating film 105b, and the contact hole CH4 is formed on the source connection electrode 12b.

Figure 14:
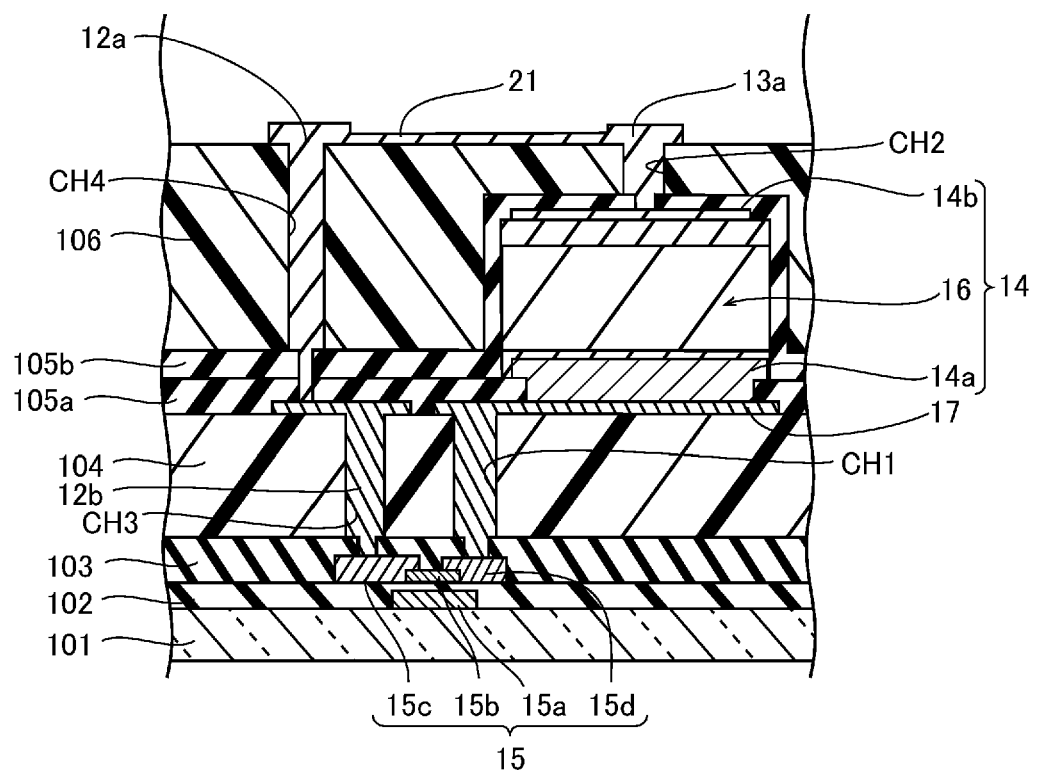
FIG. 14 is a cross-sectional view (10) for explaining a manufacturing process of the photoelectric conversion panel 1.

In step S14, as illustrated in FIG. 14, the bias line 13a and the data line 12a are formed on the first organic film 106. For example, an ITO film and a film made of titanium (Ti), aluminum (Al), and titanium (Ti) are formed by a sputtering method, and wet etching and dry etching are performed to form the bias line 13a and the data line 12a. The data line 12a is formed in the same layer as a wiring line layer in which the bias line 13a is formed.

Figure 15:
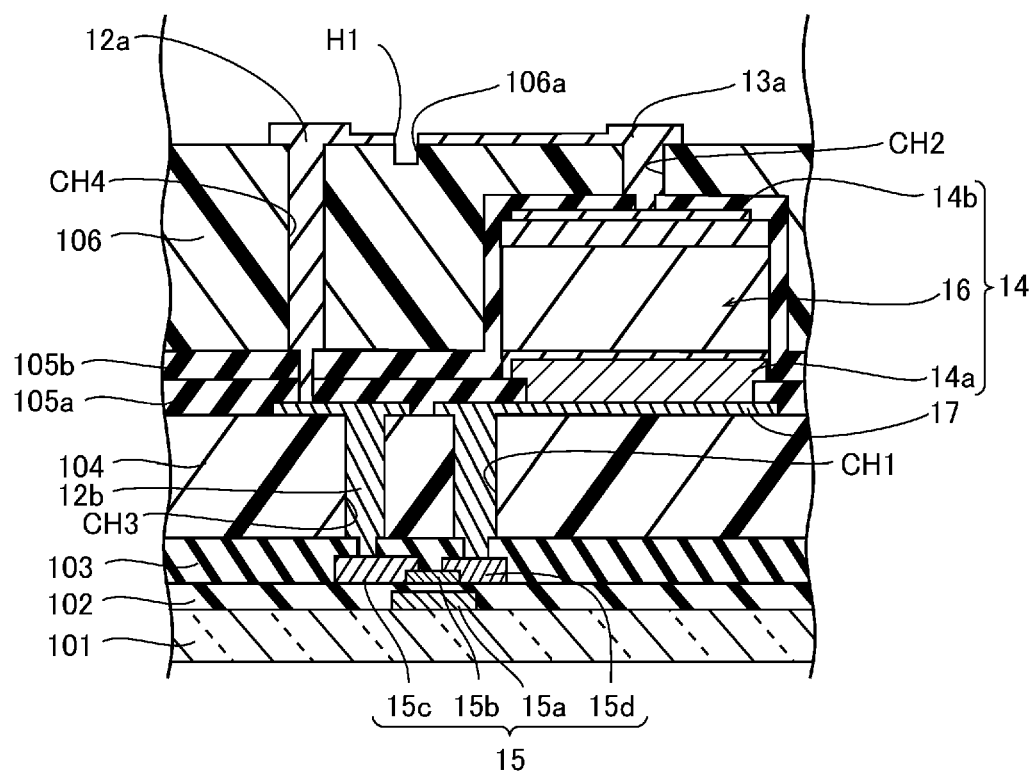
FIG. 15 is a cross-sectional view (11) for explaining a manufacturing process of the photoelectric conversion panel 1.

Here, as illustrated in FIG. 14, the material of the bias line 13a and the data line 12a remains between the bias line 13a and the data line 12a, and thus the bias line 13a and the data line 12a are connected to each other. Thus, as illustrated in FIG. 15, in step S15, the bias line 13a is disconnected from the data line 12a to prevent a short circuit between the bias line 13a and the data line 12a. For example, a connection portion 21 between the bias line 13a and the data line 12a is irradiated with laser light to remove the connection portion 21. This forms a space (portion H1) between the bias line 13a and the data line 12a, and the recessed portion 106a is formed in the first organic film 106.

Figure 16:
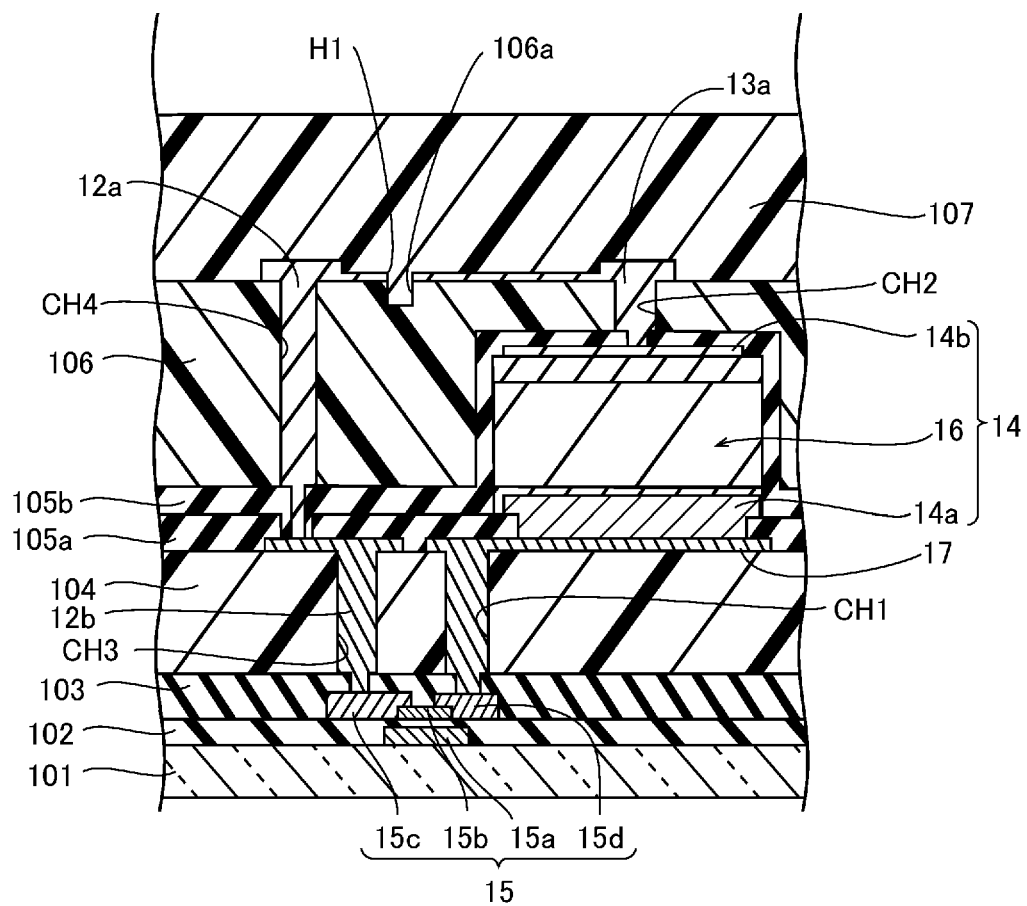
FIG. 16 is a cross-sectional view (12) for explaining a manufacturing process of the photoelectric conversion panel 1.
Figure 17:
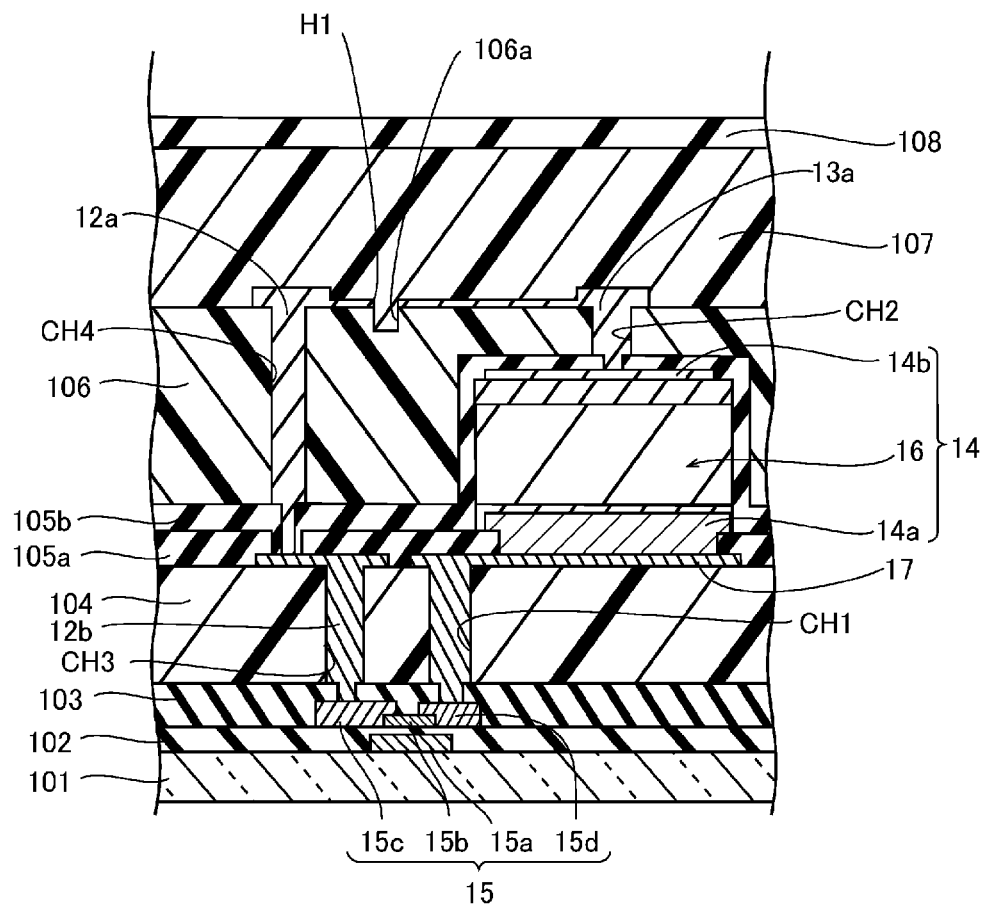
FIG. 17 is a cross-sectional view (13) for explaining a manufacturing process of the photoelectric conversion panel 1.

In step S16, as illustrated in FIG. 16, the second organic film 107 that covers the first organic film 106, the bias line 13a, and the data line 12a is formed. The second organic film 107 is formed so as to fill the portion H1 and the recessed portion 106a. For example, photosensitive acrylic resin is applied to form the second organic film 107.

In step S17, the first inorganic insulating film 108 that covers the second organic film 107 is formed. For example, an inorganic insulating film made of silicon nitride (SiNx) is formed by a CVD method, and a photolithography method and dry etching are performed to form the first inorganic insulating film 108.

In step S18, the third organic film 109 that covers the first inorganic insulating film 108 is formed. For example, photosensitive acrylic resin is applied to the first inorganic insulating film 108 to form the third organic film 109 as illustrated in FIG. 3. This manufactures the photoelectric conversion panel 1 and combines the photoelectric conversion panel 1 with the scintillator 2 to manufacture the X-ray imaging panel 10.

According to the above-described manufacturing method, in step S15, the step of disconnecting the bias line 13a from the data line 12a is performed, and part of the second organic film 107 is disposed between the bias line 13a and the data line 12a (in the recessed portion 106a) even when the recessed portion 106a is formed in the first organic film 106. Then, the second organic film 107 covers the first organic film 106, the bias line 13a, and the data line 12a, and thus the upper surface of the photoelectric conversion panel 1 is leveled by the second organic film 107. Then, the leveled upper surface is covered with the first inorganic insulating film 108, and thus a gap is prevented from being formed in the first inorganic insulating film 108. This can block moisture from entering the second organic film 107 by using the first inorganic insulating film 108 and prevent moisture from entering the first organic film 106, the photodiode 14, and the TFT 15 via the second organic film 107. As a result, a short circuit between the bias line 13a and the data line 12a can be prevented, and characteristics of the photodiode 14 and the TFT 15 can be prevented from changing.

Embodiments have been described above, but the embodiments described above are merely examples for implementing the disclosure. Thus, the disclosure is not limited to the embodiments described above and can be implemented by modifying the embodiments described above as appropriate without departing from the scope of the disclosure.

(1) In the embodiments described above, the examples are illustrated in which the photoelectric conversion panel is applied to an X-ray imaging panel for an X-ray imaging device, but the disclosure is not limited to these examples. That is, the photoelectric conversion panel described above may be applied to a panel for an optical sensor other than X-rays.

(2) In the embodiments described above, the examples of the film thicknesses of the layers (films) constituting the photoelectric conversion panel, the materials, and the manufacturing method are illustrated, but the disclosure is not limited to these examples. That is, the layers (films) constituting the photoelectric conversion panel may be configured by adopting the film thicknesses, the materials, and the manufacturing method other than the examples described above. For example, the first organic film to the fourth organic film may be composed of different organic materials from one another. The first inorganic insulating film, the second lower inorganic insulating film, the second upper inorganic insulating film, and the third inorganic insulating film may be composed of different inorganic materials from one another. The semiconductor layer of the TFT may be configured of a material other than the In—Ga—Zn—O based oxide semiconductor (for example, silicon).

(3) In the embodiments described above, the examples in which an inorganic insulating film is not provided between the first organic film and the second organic film are illustrated, but the disclosure is not limited to these examples. In other words, an inorganic insulating film may be provided between the first organic film and the second organic film.

The photoelectric conversion panel, the X-ray imaging panel, and the manufacturing method of the photoelectric conversion panel that have been described above may be described as in the following.

A photoelectric conversion panel according to a first configuration includes: a substrate; a thin film transistor disposed on the substrate; a photoelectric conversion element disposed on an upper layer from the thin film transistor; a first organic film formed on an upper layer from the photoelectric conversion element; a wiring line layer formed on an upper layer from the first organic film; a second organic film covering the first organic film and the wiring line layer; and an inorganic insulating film covering the second organic film. The wiring line layer includes a bias line connected to the photoelectric conversion element and a data line connected to the thin film transistor and separated from the bias line. Part of the second organic film is disposed between the bias line and the data line (a first configuration).

In the first configuration, the first organic film may include a recessed portion in which part of the second organic film is disposed between the bias line and the data line (a second configuration).

According to the above-described first and second configurations, part of the second organic film is disposed between the bias line and the data line even when the recessed portion is formed in the first organic film by performing a step of disconnecting the bias line from the data line to prevent a short circuit between the bias line and the data line. Then, the second organic film covers the first organic film, the bias line, and the data line, and thus an upper surface of the photoelectric conversion panel is leveled by the second organic film. Then, the leveled upper surface is covered with the inorganic insulating film, and thus a gap is prevented from being formed in the inorganic insulating film. This can block moisture from entering the second organic film by using the inorganic insulating film and prevent moisture from entering the first organic film, the photoelectric conversion element, and the thin film transistor via the second organic film. As a result, a short circuit between the bias line and the data line can be prevented, and characteristics of the thin film transistor and the photoelectric conversion element can be prevented from changing.

In the first or second configuration, the photoelectric conversion panel may further include a third organic film covering the inorganic insulating film (a third configuration).

According to the third configuration described above, the X-ray imaging panel can be manufactured by disposing the scintillator on an upper layer of the third organic film.

In any one of the first to third configurations, the thin film transistor may include an In—Ga—Zn—O based oxide semiconductor (a fourth configuration).

According to the fourth configuration described above, the photoelectric conversion panel including the thin film transistor having high speed performance can be provided. The In—Ga—Zn—O-based oxide semiconductor may be reduced by the inorganic insulating film and a threshold value of the thin film transistor may be negatively shifted. However, according to the fourth configuration described above, the inorganic insulating film is formed on an upper layer from the second organic film, and thus the inorganic insulating film is disposed away from the thin film transistor. As a result, reduction of the In—Ga—Zn—O-based oxide semiconductor by the inorganic insulating film can be prevented, and negative shift of the threshold voltage of the thin film transistor can be prevented.

An X-ray imaging panel according to a fifth configuration includes: a photoelectric conversion panel; and a scintillator overlapping the photoelectric conversion panel, wherein the photoelectric conversion panel includes a substrate, a thin film transistor disposed on the substrate, a photoelectric conversion element disposed on an upper layer from the thin film transistor, a first organic film formed on an upper layer from the photoelectric conversion element, a wiring line layer formed on an upper layer from the first organic film, a second organic film covering the first organic film and the wiring line layer, and an inorganic insulating film covering the second organic film, the wiring line layer includes a bias line connected to the photoelectric conversion element, and a data line connected to the thin film transistor and separated from the bias line, and part of the second organic film is disposed between the bias line and the data line (a fifth configuration).

According to the fifth configuration described above, the X-ray imaging panel capable of preventing a short circuit between the bias line and the data line and preventing characteristics of the thin film transistor and the photoelectric conversion element from changing can be provided.

A manufacturing method of a photoelectric conversion panel according to a sixth configuration includes: forming a thin film transistor on a substrate; forming a photoelectric conversion element on an upper layer from the thin film transistor; forming a first organic film on an upper layer from the photoelectric conversion element; forming, on an upper layer from the first organic film, a wiring line layer including a bias line connected to the photoelectric conversion element and a data line connected to the thin film transistor; disconnecting the bias line from the data line; forming a second organic film covering the first organic film, the bias line, and the data line, part of the second organic film being disposed between the bias line and the data line; and forming an inorganic insulating film covering the second organic film (a sixth configuration).

According to the sixth configuration described above, the manufacturing method of a photoelectric conversion panel capable of preventing a short circuit between the bias line and the data line and preventing characteristics of the thin film transistor and the photoelectric conversion element from changing can be provided.

In the sixth configuration, disconnecting the bias line from the data line may include irradiating the wiring line layer with laser light to remove part of the wiring line layer and form a recessed portion, and forming the second organic film may include forming the second organic film to fill the recessed portion (a seventh configuration).

According to the seventh configuration described above, the bias line and the data line can be easily prevented from being short-circuited by removing part of the wiring line layer by using laser light. Since the second organic film is formed so as to fill the recessed portion, the upper surface of the photoelectric conversion panel (upper surface of the second organic film) during manufacturing can be leveled. This forms the inorganic insulating film on the leveled upper surface and thus can prevent a gap from being formed in the inorganic insulating film.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A photoelectric conversion panel, comprising:
a substrate;
a thin film transistor disposed on the substrate;
a photoelectric conversion element disposed on an upper layer from the thin film transistor;
a first organic film formed on an upper layer from the photoelectric conversion element;
a wiring line layer formed on an upper layer from the first organic film;
a second organic film covering the first organic film and the wiring line layer; and
an inorganic insulating film covering the second organic film,
wherein the wiring line layer includes
a bias line connected to the photoelectric conversion element and
a data line connected to the thin film transistor and separated from the bias line, and
part of the second organic film is disposed between the bias line and the data line.

2. The photoelectric conversion panel according to claim 1,
wherein the first organic film includes a recessed portion in which part of the second organic film is disposed between the bias line and the data line.

3. The photoelectric conversion panel according to claim 1, further comprising
a third organic film covering the inorganic insulating film.

4. The photoelectric conversion panel according to claim 1,
wherein the thin film transistor includes an In—Ga—Zn—O based oxide semiconductor.

5. An X-ray imaging panel, comprising:
a photoelectric conversion panel; and
a scintillator overlapping the photoelectric conversion panel,
wherein the photoelectric conversion panel includes
a substrate,
a thin film transistor disposed on the substrate,
a photoelectric conversion element disposed on an upper layer from the thin film transistor,
a first organic film formed on an upper layer from the photoelectric conversion element,
a wiring line layer formed on an upper layer from the first organic film,
a second organic film covering the first organic film and the wiring line layer, and
an inorganic insulating film covering the second organic film,
the wiring line layer includes
a bias line connected to the photoelectric conversion element and
a data line connected to the thin film transistor and separated from the bias line, and
part of the second organic film is disposed between the bias line and the data line.

6. A manufacturing method of a photoelectric conversion panel, comprising:
forming a thin film transistor on a substrate;
forming a photoelectric conversion element on an upper layer from the thin film transistor;
forming a first organic film on an upper layer from the photoelectric conversion element;
forming, on an upper layer from the first organic film, a wiring line layer including a bias line connected to the photoelectric conversion element and a data line connected to the thin film transistor;
disconnecting the bias line from the data line;
forming a second organic film covering the first organic film, the bias line, and the data line, part of the second organic film being disposed between the bias line and the data line; and
forming an inorganic insulating film covering the second organic film.

7. The manufacturing method of a photoelectric conversion panel according to claim 6,
wherein disconnecting the bias line from the data line includes irradiating the wiring line layer with laser light to remove part of the wiring line layer and form a recessed portion, and
forming the second organic film includes forming the second organic film to fill the recessed portion.

* * * * *